United States Patent
Tan (10) Patent No.: US 11,296,516 B2
(45) Date of Patent: Apr. 5, 2022

(54) BATTERY MANAGEMENT SYSTEM

(71) Applicant: Grace Connection Microelectronics Limited, Taipei (TW)

(72) Inventor: Cher Ming Tan, Taipei (TW)

(73) Assignee: GRACE CONNECTION MICROELECTRONICS LIMITED

(*) Notice: Subject to any disclaimer, the term of this patent is extended or adjusted under 35 U.S.C. 154(b) by 256 days.

(21) Appl. No.: 16/434,152

(22) Filed: Jun. 6, 2019

(65) Prior Publication Data
US 2020/0036197 A1     Jan. 30, 2020

(30) Foreign Application Priority Data
Jul. 27, 2018  (TW) .................................. 107126091

(51) Int. Cl.
*H02J 7/00*     (2006.01)
*G01R 31/388*   (2019.01)

(52) U.S. Cl.
CPC .......... *H02J 7/0021* (2013.01); *G01R 31/388* (2019.01)

(58) Field of Classification Search
CPC .......... H02J 7/0021; H02J 7/00; G01R 31/288
See application file for complete search history.

(56) References Cited

U.S. PATENT DOCUMENTS

| | | | |
|---|---|---|---|
| 10,175,303 B2* | 1/2019 | Baba ..................... | G01R 31/389 |
| 2009/0066291 A1* | 3/2009 | Tien ....................... | H02J 7/0069 320/118 |
| 2011/0193528 A1* | 8/2011 | Huggins ............. | H01M 10/482 320/134 |
| 2015/0108991 A1* | 4/2015 | Aoshima ............ | G01R 31/3648 324/430 |

* cited by examiner

*Primary Examiner* — Vuthe Siek
(74) *Attorney, Agent, or Firm* — TomanageIP (57) ABSTRACT

The invention provides a battery managing system, which includes: a charging/discharging unit, configured to operably charge/discharge the battery; a sensing unit, configured to operably sense a voltage, a discharging current and a discharging duration time of the battery during discharging the battery; and a calculating unit, determining a charge/discharge capability of the battery according to the voltage, the discharge current, the discharge duration time, and temperature of the battery. According to the present invention, the battery managing system can be included in a chip insides each cell of the battery for early indication of poor reliability, so that the chip can be used to determine the charge/discharge capability or to prevent explosion.

13 Claims, 11 Drawing Sheets

BATTERY MANAGEMENT SYSTEM

CROSS REFERENCE

THE present invention claims priority to TW 107126091, filed on Jul. 27, 2018.

BACKGROUND OF THE INVENTION

Field of Invention

The present invention relates to a battery management system, especially a battery management system for determining a charge/discharge capability of the battery according to a voltage, a discharging current, and a discharging duration time of the battery during discharging the battery.

Description of Related Art

For the battery management, a state of health (SOH), a state of charge (SOC), etc., are key indexes of charge/discharge capabilities of the battery. According to traditional battery management technology, the determination of the state of health or the state of charge, is based on a total Coulomb counting of the battery by fully discharging the battery. However, a lot of electrical devices cannot normally work after fully discharging the battery which supplies power to the electrical devices, and the full discharge can cause damage in the battery which seriously affects life of the battery. In short, the obtained maximal storage capacity by the full discharge, is different from the maximal storage capacity after the full discharge. Even a prior fast discharge process for determining the maximal storage capacity, can also cause damage in the battery. Besides, in the fast discharge process, the noise is very high and the discharge current is large, wherein a high proportion of electrical power is transformed into heat according to Joule effect, such that a sensing accuracy of the maximal storage capacity is poor.

Therefore, for safety purpose, the maximal storage capacity determined by fully discharging the battery is an inaccurate value, which should be multiplied by a proportion (less than 1) to underestimate the obtained value, for avoiding misjudgment based on the inaccurate value. However, this safety consideration results in underestimating the battery life, and it possibly brings unnecessary waste and environmental pollution.

Besides, the prior battery management usually determines the maximal storage capacity of the battery, by monitoring a voltage or an internal resistance of the battery. These kinds of determination are based on a limitation that the voltage and the internal resistance can correspond to the maximal storage capacity of the battery which works normally. When the battery does not work normally (for example, internal structural damage), the storage capacity of the battery downgrades, and the estimation of the maximal storage capacity is no longer accurate.

In view of the above, the battery management system with instant monitoring and accurate determination capabilities is very important.

Usually, when the charge/discharge capability of the battery downgrades, this downgrade may be caused by poor performance of at least one battery cell in the battery. Electrical connections between the battery cells can be serial connection or parallel connection. The poor battery cell, may cause that all of the battery cells in serial connection cannot output power, or the poor battery cell in parallel connection take too much power such that other battery cells in the battery are hardly to be fully charged. It is an excessive waste that the battery is deserted just because of few poor battery cells therein. However, if not deserted, the poor battery has a potential explosion risk during continuously charging/discharging the poor battery. Therefore, how to avoid a waste to desert the battery with few poor battery cells, or to avoid the explosion of the poor battery, is very important.

SUMMARY OF THE INVENTION

In view of the above, the present invention provides a battery management system, which is capable of instantly determining a charge/discharge capability of the battery according to a voltage, a discharging current, and a discharging duration time of the battery during discharging the battery.

In one perspective, the present invention provides a battery management system, which includes a charging/discharging unit, configured to charge or discharge a battery; a sensing unit, sensing a voltage, a discharging current, and discharging duration time of the battery during discharging the battery; and a calculating unit, determining a charge/discharge capability of the battery according to the voltage, the discharging current, and the discharging duration time. In one embodiment, the temperature of the battery can be further included for determining charge/discharge capability of the battery.

In one embodiment, the battery is configured to operably discharge for supplying power to an external device.

In one embodiment, the charge/discharge capability of the battery, includes a state of health (SOH), a state of charge (SOC), or an end of life of the battery.

In one embodiment, the battery has a maximal storage capacity, and the battery management system determines the maximal storage capacity according to the voltage, the discharging current, and the discharging duration time. The battery management system determines the state of charge, according to the maximal storage capacity, the discharging current, and the discharging duration time.

In one embodiment, the battery includes a plurality of battery cells, which are electrically connected (for example, serial connection, parallel connection, or serial-parallel connection) to each other. Each of the battery cells includes a maximal cell storage capacity. The battery management system determines the maximal cell storage capacity, according to a voltage, a discharging current, and discharging duration time of each of the battery cells during discharging the battery.

In one embodiment, the battery cells include a lower storage capacity cell, which is adjacent to at least another battery cell in an electrical connection with the lower storage capacity cell. When a maximal cell storage capacity of the lower storage capacity battery cell is lower than a threshold, the battery management system does not conduct the lower storage capacity battery cell with the at least another battery cell in the electrical connection. In one embodiment, the battery further comprises a replaceable battery cell. When the maximal cell storage capacity of the lower storage capacity battery cell is lower than the threshold, the battery management system conducts the replaceable battery cell with the at least another battery cell in the electrical connection.

In one embodiment, since the battery starting discharging, the battery management system determines the state of health and the state of charge of the battery, according to the voltage, the discharging current, and the discharging duration time before the battery is fully discharged.

In one embodiment, the battery management system determines the end of life of the battery, based on the state of health and a life threshold ratio.

In one embodiment, the battery includes a positive electrode and a negative electrode, wherein the battery has a maximum capacity effectiveness of the positive electrode, and a maximum capacity effectiveness of the negative electrode. The calculating unit determines a charge/discharge capability of the battery according to maximum capacity effectivenesses of the positive and negative electrodes.

In one embodiment, the battery further comprises a Warburg impedance, and the sensing unit senses the Warburg impedance of the battery during the battery charging/discharging. The calculating unit determines the charge/discharge capability for a diffusion capability according to the Warburg impedance. Therefore, a separator and an electrolyte in the battery can be sensed and monitored.

In one embodiment, the sensing unit senses a working temperature of the battery during discharging the battery, and the calculating unit determines the charge/discharge capability of the battery, according to the voltage, the discharging current, the discharging duration time, the working temperature, and the working temperature.

DESCRIPTION OF THE PREFERRED EMBODIMENTS

The objectives, technical details, features, and effects of the present invention will be better understood with regard to the detailed description of the embodiments below, with reference to the figures.

Figure 1:
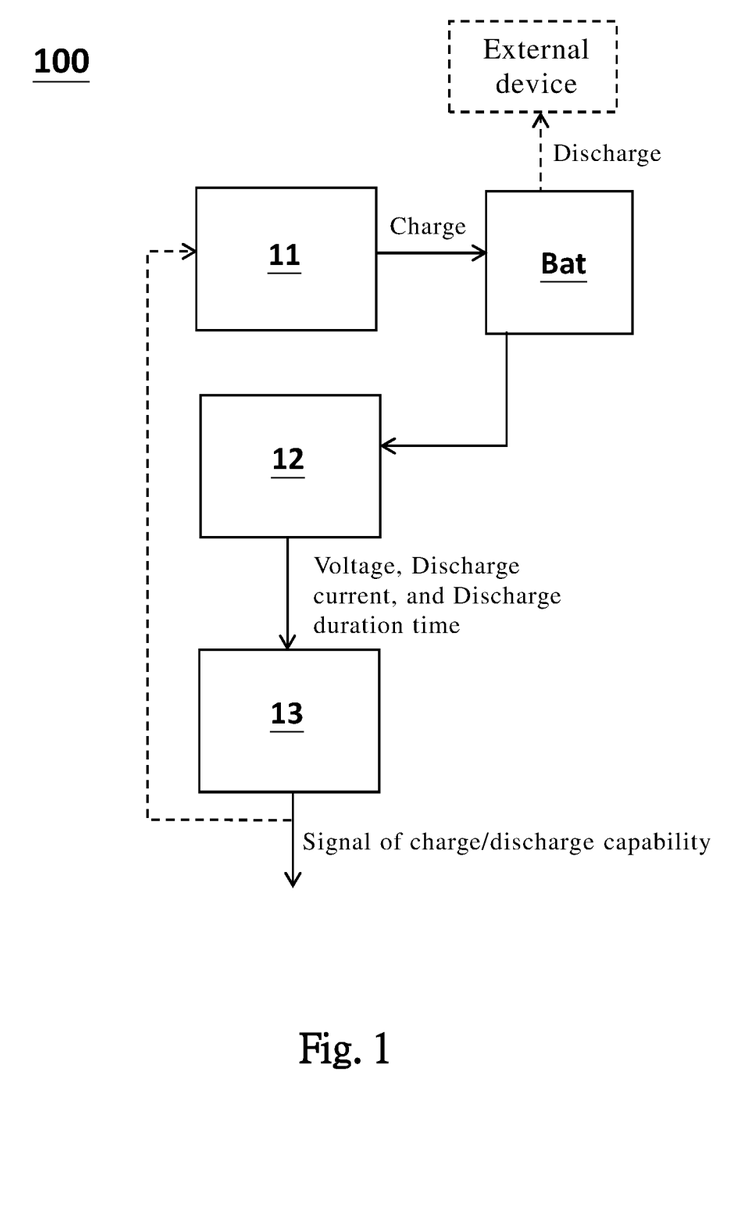
FIG. 1 is a schematic view of the battery management system according to one embodiment of the present invention.

Please refer to FIG. 1, which is a schematic view of a battery management system 100 according to one embodiment of the present invention. The battery management system 100 includes: a charging/discharging unit 11, configured to charge or discharge a battery BAT; a sensing unit 12, sensing a voltage, a discharging current, and discharging duration time of the battery during discharging the battery BAT; and a calculating unit 13, determining a charge/discharge capability of the battery BAT according to the voltage, the discharging current, and the discharging duration time. The determined charge/discharge capability can be sent to other components or circuits in a form of a signal, for processing the signal of the charge/discharge capability. For one example, the signal is sent to the charging/discharging unit 11, for controlling the charge/discharge operation of the battery BAT. For another example, when the battery reaches an end of life, or at least one maximal storage capacity of battery cells in the battery is too low, the charge/discharge is stopped, and a user take some necessary measures correspondingly (e.g. check or replace component).

One feature of the present invention, is the charge/discharge capability of the battery BAT can be instantly determined, according to the voltage, the discharging current and the discharging duration time of the battery BAT. Importantly, the obtained charge/discharge capability of the present invention is not (neither includes) an estimated value determined by the voltage of fully discharge or resistance in the prior art. The obtained charge/discharge capability of the present invention, is a direct charge/discharge capability of the battery BAT (no need to underestimate the obtained value). For example, the obtained value is the maximum amount of electrochemically active ions inside the battery. When the battery BAT is a lithium battery, the maximal storage capacity is a total electrical capacity of lithium ions in the battery BAT. Importantly, the maximal storage capacity according to the present invention, is an instant determination technology, wherein the battery BAT is not necessarily to be fully discharged for obtaining the maximal storage capacity as in the prior art. According to the present invention, the maximal storage capacity of the battery BAT, is determined according to the voltage, the discharging current and the discharging duration time of the battery BAT, during discharging the battery BAT.

Figure 2:
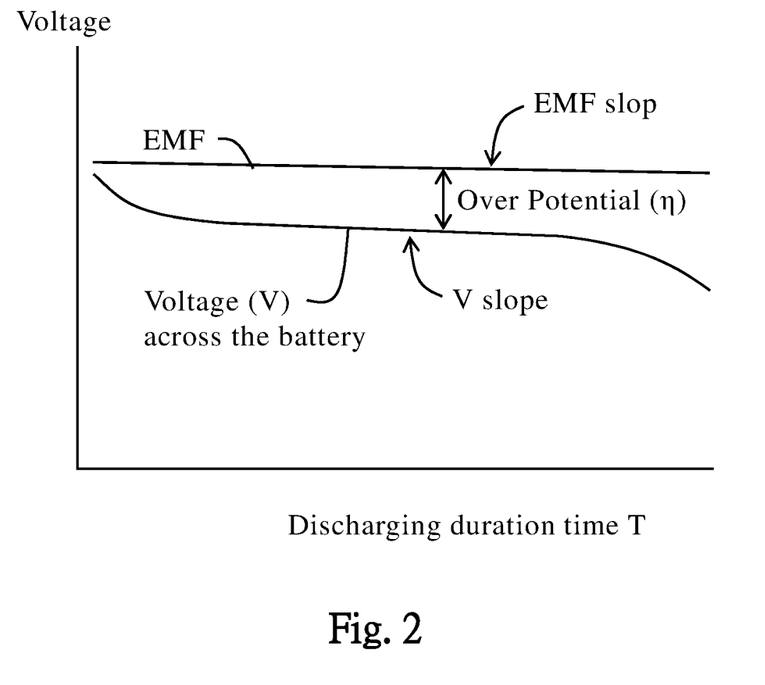
FIG. 2 illustrates a relation between an over potential in the battery and a voltage across the battery according to one embodiment of the present invention.

In short, according to the present invention, the maximal storage capacity can be determined during a usual battery discharge, which is different from the prior art that the maximal storage capacity is specially determined by fully discharging the battery BAT. In FIG. 2, the battery is configured to operably discharge for supplying power to an external device.

However, in the prior art, the charging/discharging unit 11 can be used to control a discharge of the battery BAT. For example, a weak current discharge of the battery BAT can be used to determine an electromotive force (EMF, FIG. 2) of the battery BAT. Or, an open circuit voltage can be used to determine the electromotive force of the battery BAT. However, the determined electromotive force by the prior art is not an accurate value across many battery structural elements.

The charge/discharge capability of the battery BAT, may at least include a state of health (SOH), a state of charge (SOC), or an end of life. The state of health (SOH), for example, may be obtained by dividing the maximal storage capacity Qm by a rating storage capacity Qrat. That is, SOH=Qm/Qrat. The state of charge (SOC), may be obtained by subtracting a product of discharging current I and discharging duration time T from the maximal storage capacity Qm, and then dividing the subtraction result by the maximal storage capacity Qm. That is, SOC=(Qm−I×T)/Qm. When the discharging current I is not a constant, the state of charge (SOC) can be obtained by an integral calculation of the discharging current I. The end of life can be obtained based on the state of health (SOH) and a life threshold ratio. When the state of health (SOH) is lower than the life threshold ratio, the battery BAT is determined to reach the end of life and needs to be replaced.

The aforementioned life threshold ratio, can be decided according to embodying requirement. For example, the life threshold ratio may be 85% or other proportions. Or, the life threshold ratio can be decided according to requirement or the operational characteristic of the battery BAT. The aforementioned end of life, can be determined based on the state of health (SOH) and the life threshold ratio. The comparison result can be determined according to various methods. For example, the comparison can be decided by a calculation circuit for determining the state of health (SOH) based on the life threshold ratio. Besides, the user may take other measures for determining the end of life according to the requirements.

In one embodiment, the determination of the charge/discharge capability can be not merely based on the maximal storage capacity Qm. For example, the charge/discharge capability can be determined according to the maximal storage capacity Qm, and the voltage of the battery BAT (or an internal resistance of the battery BAT). For example, the maximal storage capacity Qm and a positive electrode resistance (or a negative electrode resistance) for determining the end of life, wherein an effect of electrode resistance on the charge/discharge process may be specified for the charge/discharge capability. When the maximal storage capacity Qm of the battery BAT is high but the electrode resistance is too high, the battery BAT can be replaced for not conforming to the power supply requirements. In analyzing for replaced battery quality, a destructive test is often employed and it usually damages the internal structure of the battery BAT. Therefore, the analysis is hardly correct. On the contrary, the analysis according to the present invention, can be performed without damaging the battery BAT.

FIG. 2 illustrates a discharge status of the battery BAT. When the battery BAT is in a middle discharge stage (for example, between 200 and 4000 secs, etc.), an over potential $\eta$, the electrode resistance Re, a resistance between electrode and electrolyte Rct, the maximal storage capacity Qm, the discharging current I, and the discharging duration time T can have a simplified equation:

$$\eta(t)=I\times(Re+Rct+k\times Qm/(Qm-I\times T)+Zw)$$

wherein k is a reaction rate coefficient, which corresponds to a conversion rate through an interface between the electrode and the electrolyte. Zw is a Warburg impedance, which is elaborated in later embodiments.

After a differential calculation between the over potential $\eta$ of the battery BAT and the time:

$$d\eta/dt=-I^2\times k\times Qm/(Qm-I\times T)^2$$

A well-functioning battery BAT, has the electromotive force EMF with a smoother slope than a voltage V across the battery BAT (FIG. 2). In one period of the discharge process, the reaction rate coefficient k and the maximal storage capacity Qm are close to constants. Therefore, a relation between the voltage V and other parameters can be:

$$dV/dt=-d\eta/dt$$

$$1/(-dV/dt)^{1/2}=1/I\times(Qm/k)^{1/2}-T/(k\times Qm)^{1/2}$$

The relation between $1/(-dV/dt)^{1/2}$ and the time, the reaction rate coefficient k and the maximal storage capacity Qm can be obtained by several simple steps, such as interpolation, etc. After obtaining the maximal storage capacity Qm, the state of health, the stat of charge, the end of life, or other parameters of the battery BAT can be obtained. Through these parameters, operation statuses of every portion of the battery BAT can be obtained.

Therefore, by the voltage, the discharging current, and the discharging duration time, the charge/discharge capability Qm and the reaction rate coefficient k of the battery BAT can be directly obtained (by calculation only and without damaging the battery). In short, when the maximal storage capacity Qm is known, the charge/discharge capability of the battery BAT, such as the state of health (SOH), the state of charge (SOC), or the end of life, can be determined based on the maximal storage capacity Qm. Thereby, the present invention provides a convenient method for instantly determining the charge/discharge capability of the battery.

Figure 5:
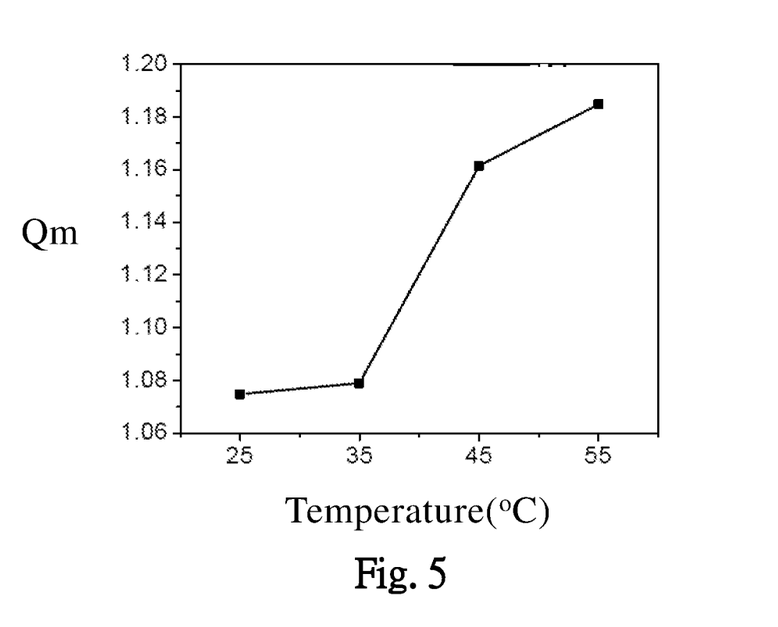
FIG. 5 illustrates an effect of working temperatures on a maximal storage capacity of the battery, according to one embodiment of the present invention.
Figure 10:
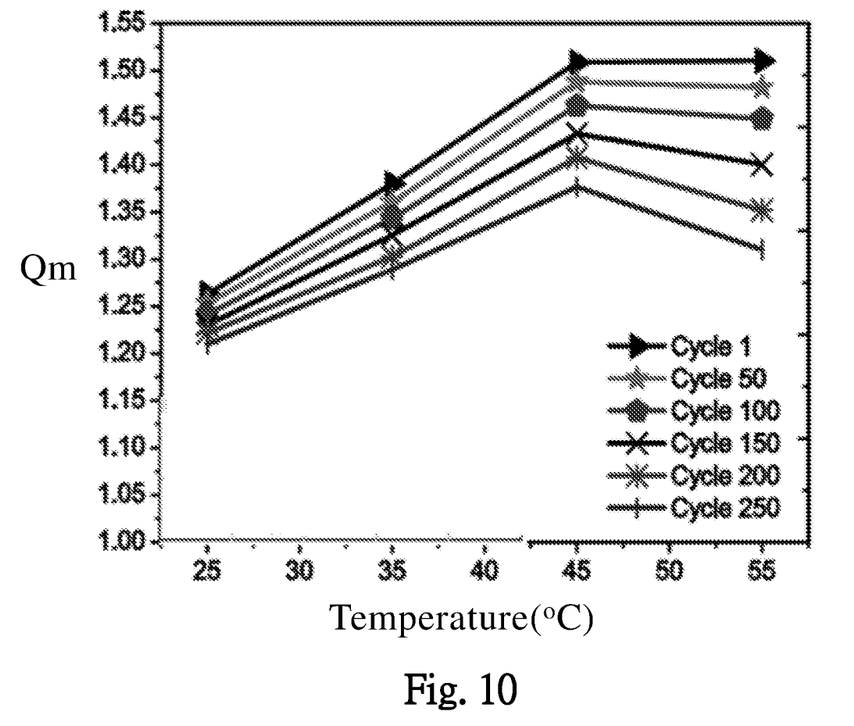
FIG. 10 illustrates effects of different working temperatures on the maximal storage capacity of the battery through various charge/discharge cycles, according to one embodiment of the present invention.

Further, the working temperature of the battery BAT can affect the value of the maximal storage capacity Qm (FIGS. 5 and 10). In one example, the battery management system 100 can further sense the working temperature, for determining the affected maximal storage capacity Qm by the working temperature (while the temperature changes, resistances Re and Rc, the reaction rate coefficient k, and the Warburg impedance Zw change correspondingly). The maximal storage capacity Qm changes while the working temperature changes. In the later embodiments, an effect of the different working temperatures on the resistances Re and Rc, the reaction rate coefficient k, and the Warburg impedance Zw, are elaborated. According to the present invention, similar to the maximal storage capacity Qm, the charge/discharge capability of the battery BAT, such as the state of health, the state of charge, or the end of life, can be determined while the working temperature changes.

The present invention provides an easy and convenient method for determining the charge/discharge capability of the battery BAT, which is capable of determining the maximal storage capacity Qm by merely sensing the voltage, the current, and the duration time during discharging the battery. The difficulty of inaccurate sensed values during the fast charge/discharge process in the prior art, is overcome by the present invention.

Figure 3:
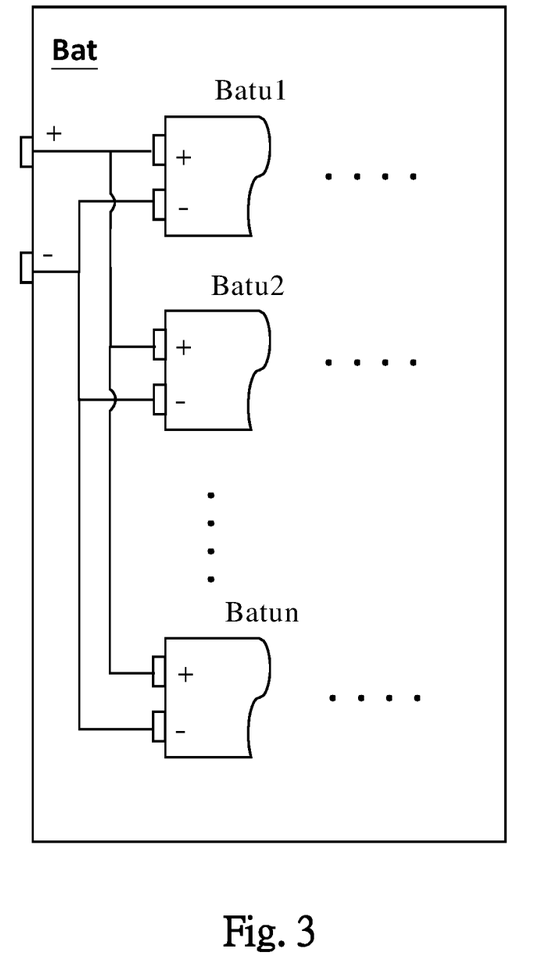
FIG. 3 is a schematic view of the battery and a plurality of battery cells in the battery according to one embodiment of the present invention.

Please refer to FIG. 3, in one embodiment, the battery Bat includes a plurality of battery cells Batu1, Batu2 . . . and Batun. The connection between the battery cells may include serial connection, parallel connection, or serial-parallel connection. The battery cells Batu1, Batu2 . . . and Batun in the figure, are to illustrate one embodiment for the battery cells, but not to limit the electrical connection between the battery cells. The battery cells Batu1, Batu2 . . . and Batun, respectively include a plurality of maximal cell storage capacities Qmu1, Qmu2 . . . and Qmun. The battery management system 100 may determine the maximal cell storage capacities Qmu1, Qmu2 . . . and Qmun, according to voltages, discharging currents, and discharging duration times respectively of the battery cells Batu1, Batu2 . . . and Batun.

The aforementioned electrode resistance Re, substantially includes internal resistances of the electrodes, connection resistances between the positive/negative electrode of the battery BAT and the positive/negative electrodes of the battery cells Batu1, Batu2 . . . and Batun, and connection resistances between the positive/negative electrode of the battery BAT and the wiring outside the battery BAT. When the electrode resistance Re increases abnormally, it may be caused by poor connection between the electrodes or wirings. Thereby, the poor connections between the positive/negative electrode of the battery BAT and the positive/negative electrodes of the battery cells, and between the positive/negative electrode of the battery BAT and the wiring outside the battery BAT, can be clearly identified and determined.

In one embodiment, the battery cells Batu1, Batu2 . . . and Batun include a lower storage capacity cell, which is adjacent to at least another battery cell in an electrical connection with the lower storage capacity cell. The wording "adjacent to" includes an electrically adjacent connection in serial connection, parallel connection, or serial-parallel connection. For example, when the battery cell Batu2 is the lower storage capacity battery cell, it can affect the overall charge/discharge of the battery BAT. When the maximal cell storage capacity Qmu2 of the lower storage capacity battery cell Batu2 is lower than a threshold, the battery management system 100 does not conduct the lower storage capacity battery cell Batu2 with the at least another battery cell (original adjacent battery cell in electrically parallel connection) in the electrical connection. Thus, the adjusted electrical parallel connection of the battery cells Batu1, . . . and Batun does not include the battery cell Batu2. In one embodiment, the battery cells Batu1, Batu2 . . . and Batun are electrically connected in series, the battery management system 100 does not conduct the lower storage capacity battery cell Batu2 with the at least another battery cell (original adjacent battery cell in electrically serial connection) in the electrical connection. Thus, the adjusted electrical serial connection of the battery cells Batu1, . . . and Batun does not include the battery cell Batu2. In one embodiment, the battery cells Batu1, Batu2 . . . and Batun are in electrically series-parallel connection, the battery management system 100 does not conduct the lower storage capacity battery cell Batu2 with the at least another battery cell (original adjacent battery cell in electrically series-parallel connection) in the electrical series-parallel connection. Thus, the adjusted electrical series-parallel connection of the battery cells Batu1, . . . and Batun does not include the battery cell Batu2. In these embodiments, the maximal cell storage capacities Qmu1, Qmu2, . . . and Qmun of the battery cells Batu1, Batu2 . . . and Batun, are separately sensed and compared for determining whether there is at least one lower storage capacity battery cell in the battery cells.

In one embodiment, the aforementioned battery cells further include a replaceable battery cell Batur. When the maximal cell storage capacity of the lower storage capacity battery cell Batu2 is lower than the threshold, the battery management system 100 conducts the replaceable battery cell Batur with the at least another battery cell (originally adjacent battery cell in the electrical connection) instead of the lower storage capacity battery cell Batu2. That is, when the battery cells Batu1, Batu2 . . . and Batun in serial, parallel, or serial-parallel connection include the lower storage capacity battery cell Batu2, and the maximal cell storage capacity Qmu2 of the lower storage capacity battery cell Batu2 is lower than the threshold, the serial, parallel, or serial-parallel connection of the original battery cells Batu1, Batu2 . . . and Batun, may be changed into the serial, parallel, or serial-parallel connection of the battery cells Batu1, Batur . . . and Batun. Therein, the replaceable battery cell Batur replaces the original battery cell Batu2 in the serial, parallel, or serial-parallel connection.

The embodiment of the present invention, can be employed in a management system for multiple batteries. For example, a battery array in a large scale, wherein when there is one battery with poor capability which can affect the total efficiency of the battery array, it can separately determine the capabilities of the batteries by determining the maximal storage capacities of the batteries, for finding out the battery with poor capability. Thereafter, the user can easily find the location of the battery with poor capability by IoT technology and replace the battery with poor capability.

In the aforementioned embodiments, since the battery starting discharging and before the battery is fully discharged, the battery management system 100 may determine the state of health and the state of charge of the battery, according to the voltage, the discharging current, and the discharging duration time. The battery management system 100 may also determine the state of health and the state of charge of each of the battery cells, according to the maximal cell storage capacity of each of the battery cells. According to the obtained maximal cell storage capacity information, the lower storage capacity battery cell can be replaced separately, and there is no need to replace all of the battery.

In one embodiment, a positive electrode of the battery BAT has a maximum capacity effectiveness of positive electrode $Q_{max+}$, a negative electrode of the battery BAT has a maximum capacity effectiveness of negative electrode $Q_{max-}$. The calculating unit 11 may determine a charge/discharge capability of the positive/negative electrode of the battery BAT, according to the maximal storage capacity $Q_m$, the maximum capacity effectiveness of positive electrode $Q_{max+}$, and the maximum capacity effectiveness of negative electrode $Q_{max-}$. The relations between the maximal storage capacity $Q_m$ and the maximum capacity effectiveness of positive electrode $Q_{max+}$, and between the maximal storage capacity $Q_m$ and the maximum capacity effectiveness of negative electrode $Q_{max-}$ are:

$$Q_{max+} = M1 \times Q_m$$

$$Q_{max-} = M2 \times Q_m$$

M1 and M2 are respectively the parameters for the maximum capacity effectivenesses of the positive and negative electrodes of the battery BAT. The best theoretical value of M1 is 1, and the best theoretical value of M2 is 0.5. The battery management system 100 may determine the status of the maximum capacity effectivenesses of the positive and negative electrodes of the battery BAT according to M1 and M2. When M1 and M2 decreases, it means that the maximum capacity effectivenesses of the positive and negative electrodes of the battery BAT decrease.

In one embodiment, an equation of over potential η of the battery BAT:

$$\eta(t) = I \times (Re + Rct + k \times Qm/(Qm - I \times T) + Zw)$$

Wherein Zw is the Warburg impedance, and equation of the Warburg impedance Zw is:

$$Zw = \sum_{n=1}^{m}(1 - \exp(-t/(Rn \times Cw)) \times Rn)$$

Figure 4:
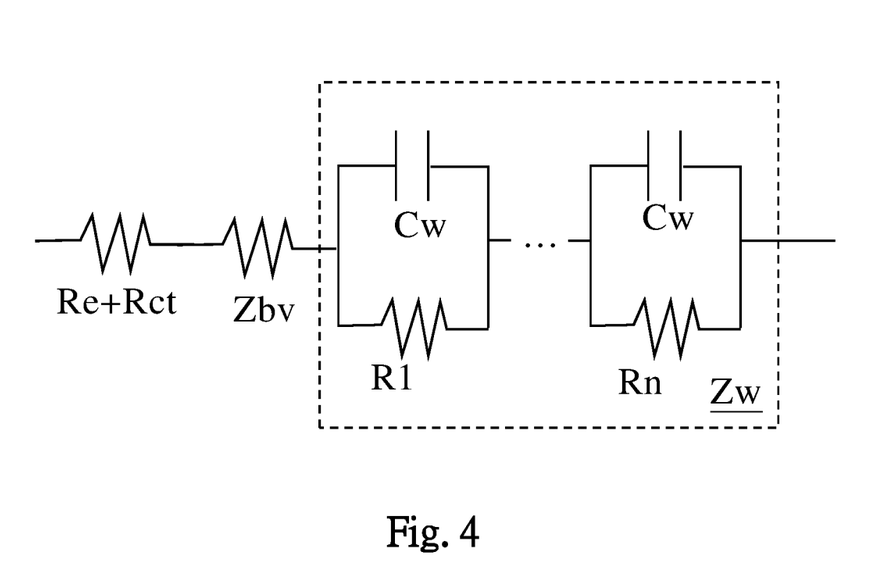
FIG. 4 is a schematic view of an equivalent circuit of a Warburg impedance Zw of the battery.

Please refer to FIG. 4, wherein an equivalent circuit of the Warburg impedance Zw, is a serial connection including multiple parallel connections which respectively include resistances R1 ... Rn and capacitances Cw. The diffusion capability of the battery BAT can be determined by sensing the Warburg impedance, and the user can decide the number of m in the equation of the Warburg impedance Zw. This Warburg impedance Zw is a known equation and therefor not elaborated herein. The aforementioned k×Qm/(Qm−I× T), can be regarded as Butler-Volmer impedance Zbv for electrochemical reaction impedance. The equation Zbv=k× Qm/(Qm−I×T), relates to a conversion speed from electrons to charges. According the equation, when the discharging duration time is longer, the Butler-Volmer impedance Zbv is higher. In one embodiment, when the working temperature is higher, the reaction rate coefficient k is higher and the Butler-Volmer impedance Zbv is correspondingly higher.

The technology provided by the present invention, can instantly monitor the charge/discharge capability of the battery, and provide a fast, low-cost, simultaneous sensing for the parameters in the discharge process. The technology provided by the present invention can further analyze effects of different working conditions on the battery.

Figure 6A:
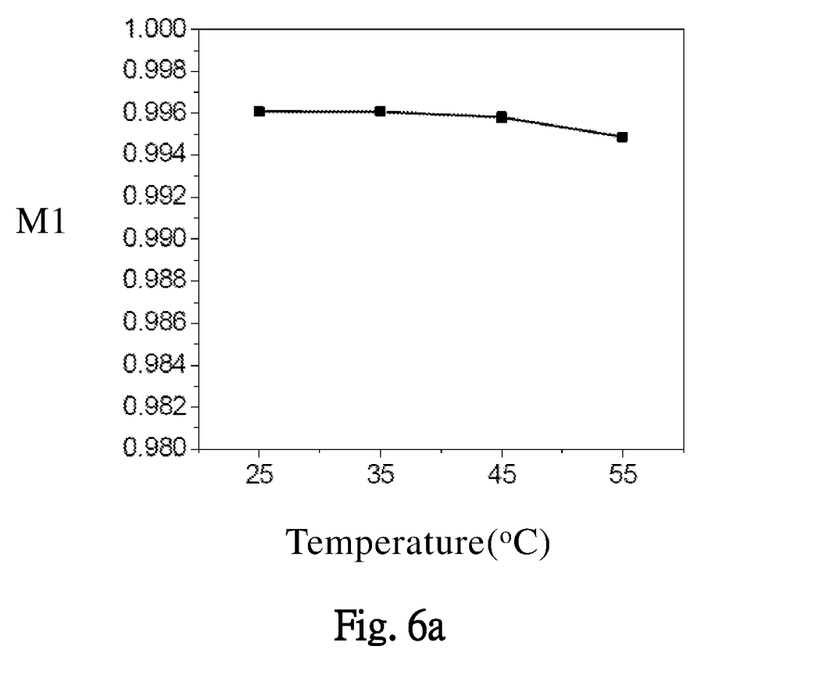
FIGS. 6a and 6b illustrate effects of different working temperatures on maximum capacity effectivenesses of positive and negative electrodes of the battery, according to one embodiment of the present invention.
Figure 6B:
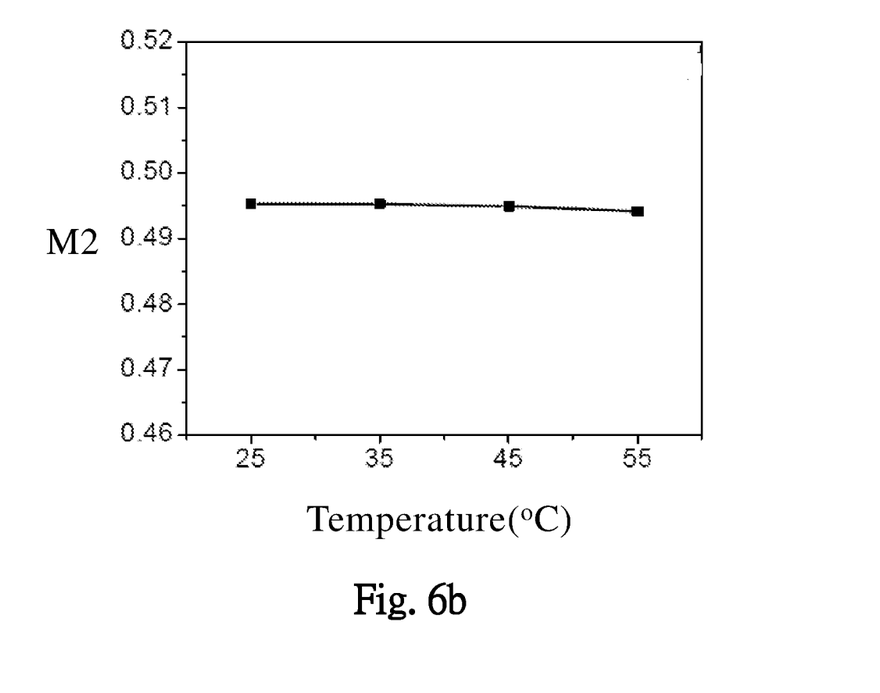

Please refer to FIG. 5, which illustrates an effect of different temperatures on the maximal storage capacity Qm of the battery BAT. According to FIG. 5, when the temperature is between 25° C. and 55° C., an increase of the temperature can increase efficiency of the redox reaction. The embodiment in FIGS. 6a and 6b, illustrate an effect of different working temperature on the maximum capacity effectivenesses of the positive and negative electrodes of the battery BAT, which are respectively represented by parameters M1 (positive electrode) and M2 (negative electrode). In FIGS. 6a and 6b, when the working temperature increases, the parameters M1 and M2 do not change much. When the working temperature is over 45° C., the parameters M1 and M2 obviously decrease (the maximum capacity effectivenesses of the positive and negative electrodes decrease).

Figure 7A:
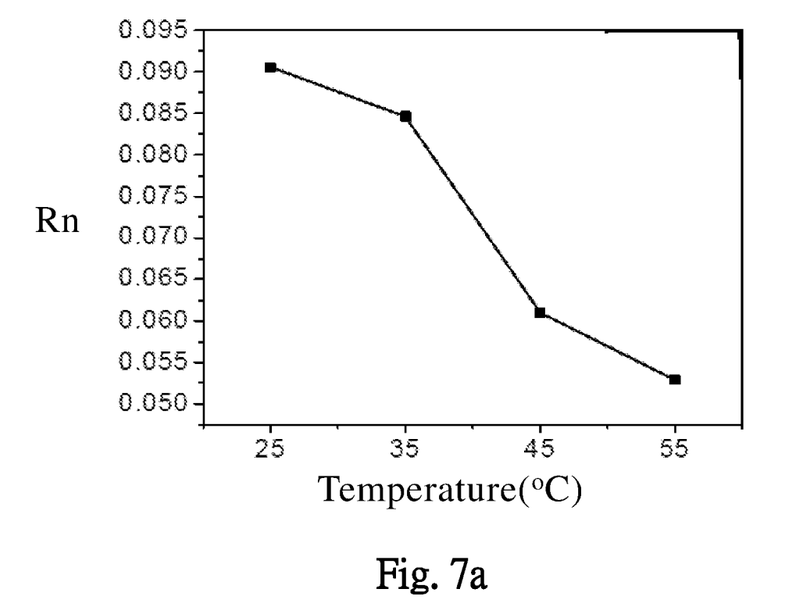
FIGS. 7a and 7b illustrate effects of different working temperatures on resistances and capacitances in the Warburg impedance of the battery, according to one embodiment of the present invention.
Figure 7B:
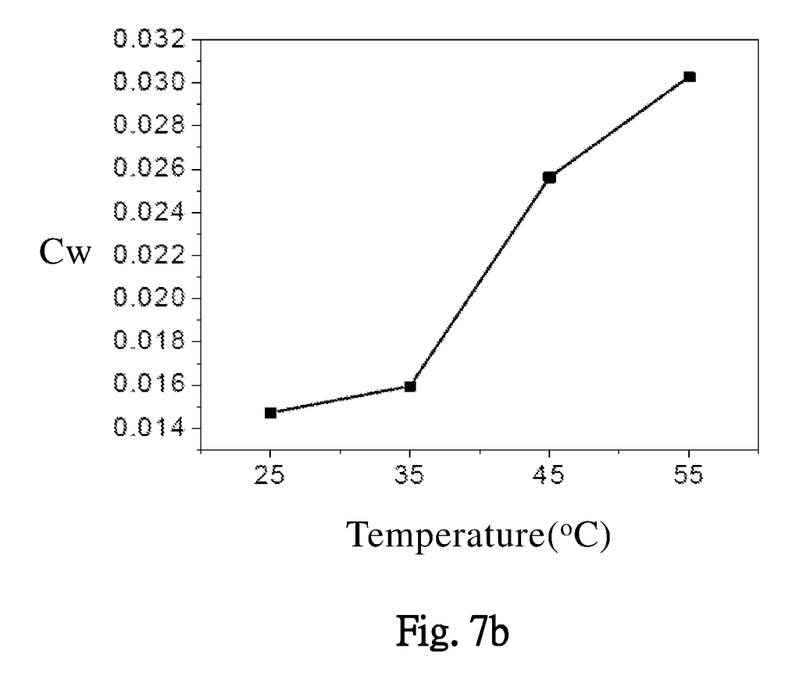

The embodiments in FIGS. 7a and 7b, illustrate an effect of different working temperatures on the resistance Rn and capacitance Cw of the Warburg impedance Zw. When the working temperature increases, the ionic concentration increases, the resistance Rn decreases, the ionic concentration on the positive and negative electrodes of the capacitance Cw increases, and the capacitance Cw increases.

Figure 8:
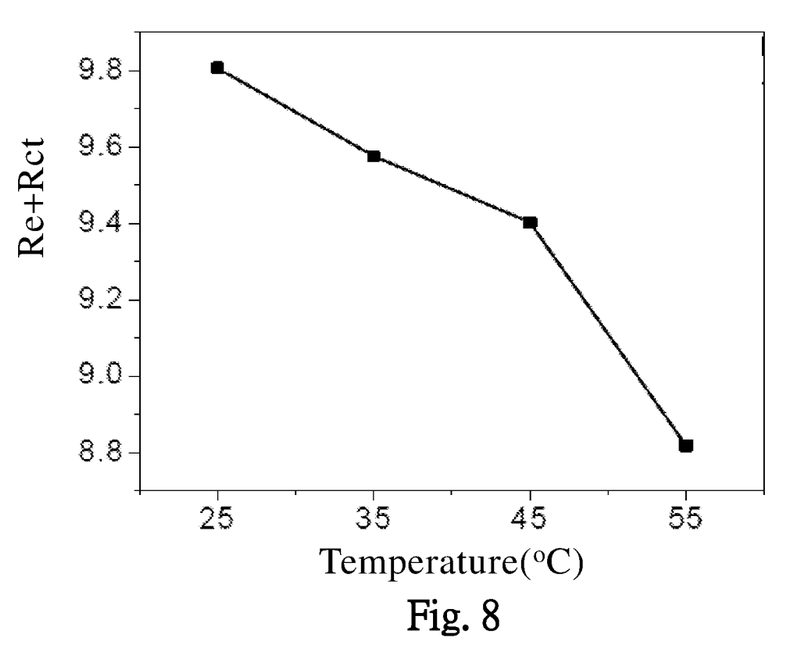
FIG. 8 illustrates effects of different working temperatures on an electrode resistance, and a resistance between electrode and electrolyte, according to one embodiment of the present invention.
Figure 9:
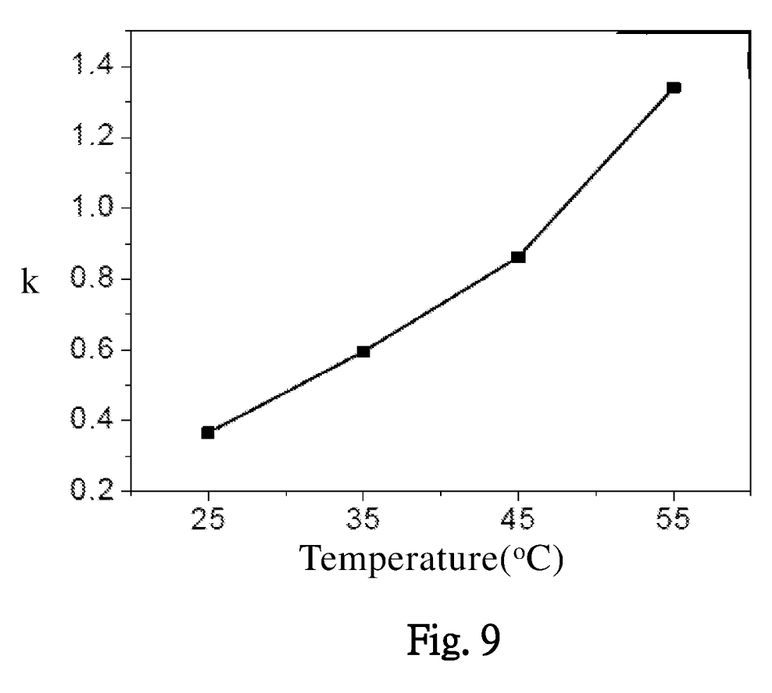
FIG. 9 illustrates effects of different working temperatures on a reaction rate coefficient of the battery, according to one embodiment of the present invention.

The embodiment of FIG. 8 illustrates an effect of different working temperatures on the electrode resistance Re and the resistance between electrode and electrolyte Rct of the battery BAT. When the temperature is between 25° C. and 45° C., the resistances Re+Rct decrease smoother. When the temperature is higher than 45° C., the resistances Re+Rct drop more obviously, which is mainly due to the increase of the charge conversion speed. The embodiment of FIG. 9 illustrates an effect of different working temperatures on the reaction rate coefficient k of the battery BAT. The reaction rate coefficient k is the conversion rate through an interface between the electrode and the electrolyte, which relates to a conversion speed from electrons to charges. When the temperature increases, the conversion rate through an interface between the electrode and the electrolyte increases. When the temperature is over 45° C., the reaction rate coefficient k increases more obviously.

Figure 11:
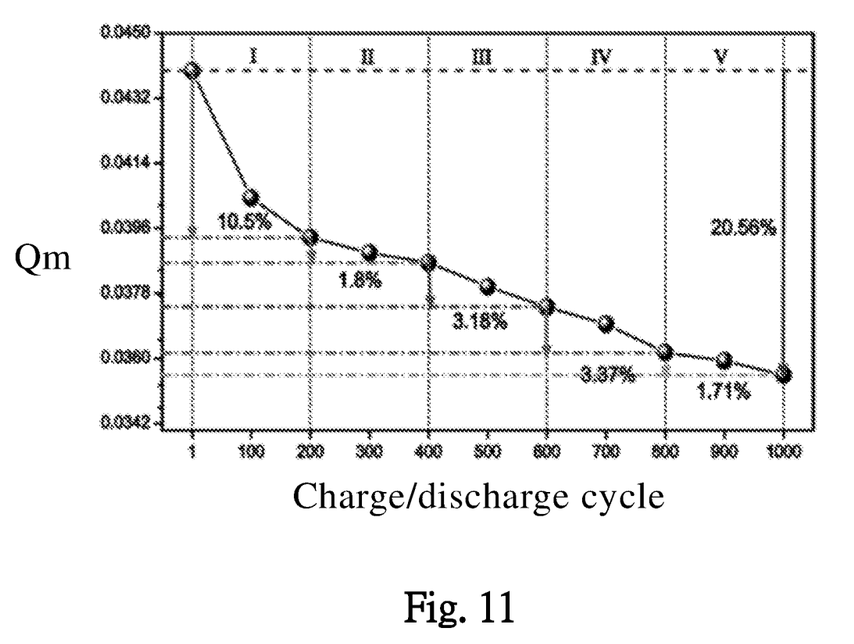
FIG. 11 illustrates effects of different charge/discharge cycles on the maximal storage capacity of the battery, according to one embodiment of the present invention.

In the embodiment of FIG. 10, an effect of different working temperatures and different charge/discharge cycles (Cycle 1, Cycle 50, ... and Cycle 250, respectively corresponds to 1, 50, ... and 250 cycles) on the maximal storage capacity Qm of the battery BAT is illustrated. In any working temperature, when the charge/discharge cycles increase, the maximal storage capacity Qm decreases correspondingly. When the temperature is over 45° C., the maximal storage capacity Qm decreases obvious while the temperature increases. FIG. 11 illustrates an effect of different charge/discharge cycles on the maximal storage capacity Qm of the battery BAT. When the charge/discharge cycles increase, the maximal storage capacity Qm decreases correspondingly.

Figure 12:
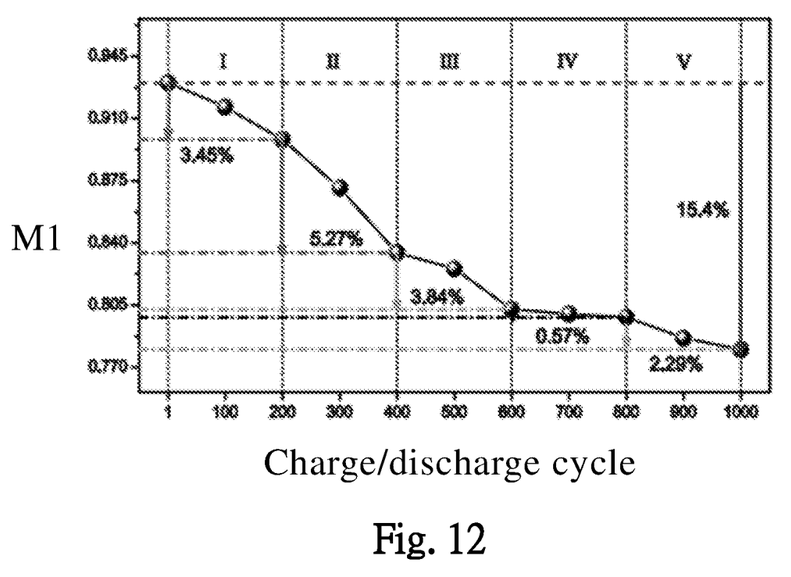
FIGS. 12 and 13 illustrate effects of different charge/discharge cycles on maximum capacity effectivenesses of positive and negative electrodes of the battery, according to one embodiment of the present invention.
Figure 13:
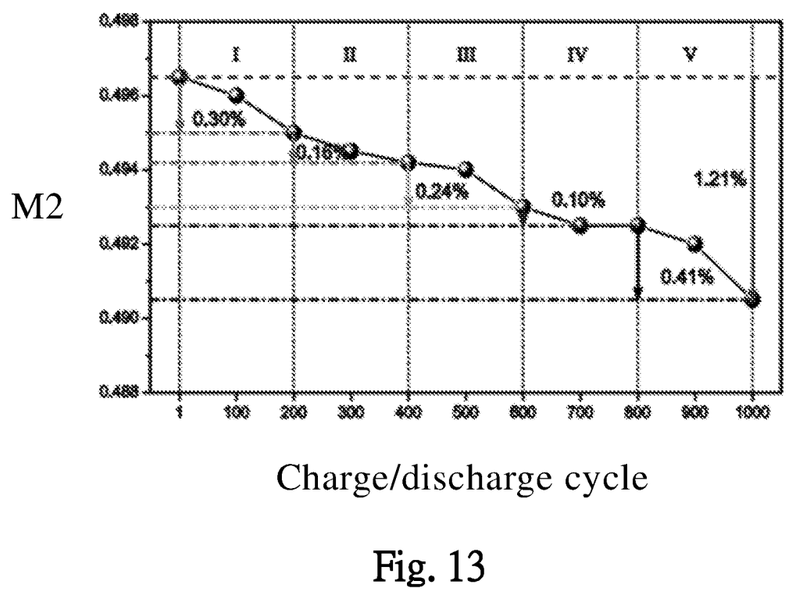

The embodiments of FIGS. 12 and 13, illustrate an effect of different charge/discharge cycles on the M1 and M2 (parameters for the maximum capacity effectivenesses of the positive and negative electrodes of the battery BAT). When the charge/discharge cycles increase, the parameters M1 and M2 decrease gradually, which means the maximum capacity effectiveness of negative electrode of the battery BAT decrease gradually while the charge/discharge cycles increase.

Figure 14:
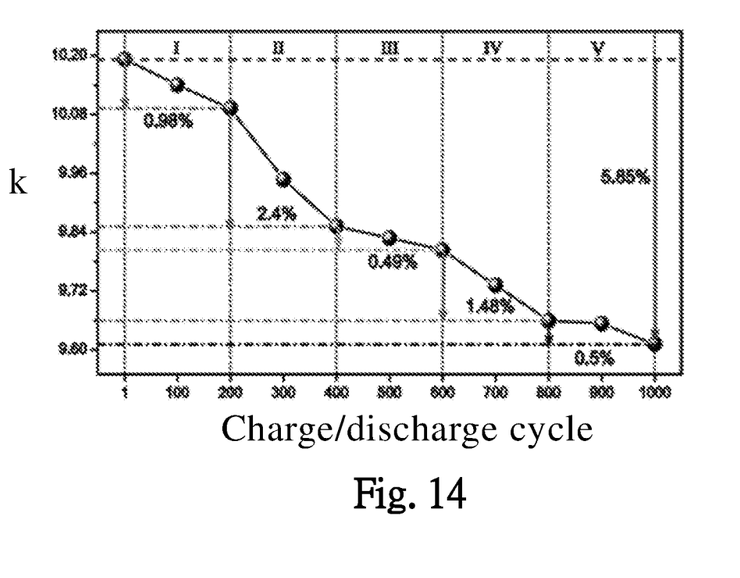
FIG. 14 illustrates effects of different charge/discharge cycles on the reaction rate coefficient of the battery, according to one embodiment of the present invention.

The embodiment of FIG. 14, illustrates an effect of different charge/discharge cycles on the reaction rate coefficient k of the batter y BAT. When the charge/discharge cycles increase, the reaction rate coefficient k decreases gradually, which means the conversion rate through an interface between the electrode and the electrolyte decreases gradually.

Figure 15:
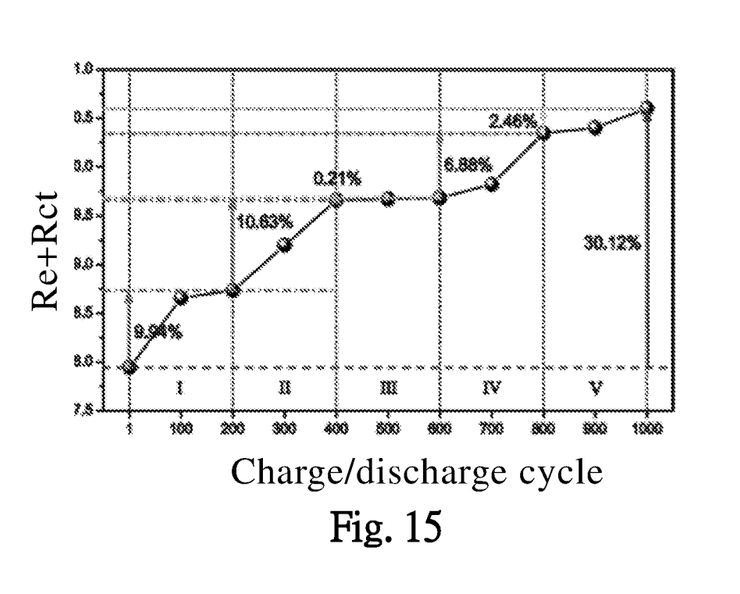
FIG. 15 illustrates effects of different charge/discharge cycles on the electrode resistance, and the resistance between electrode and electrolyte, according to one embodiment of the present invention.

The embodiment of FIG. 15, illustrates an effect of the different charge/discharge cycles on the electrode resistance Re and the resistance between electrode and electrolyte Rct of the battery BAT. In FIG. 15, when the charge/discharge cycles increase, the resistances Re+Rct increase gradually.

Figure 16A:
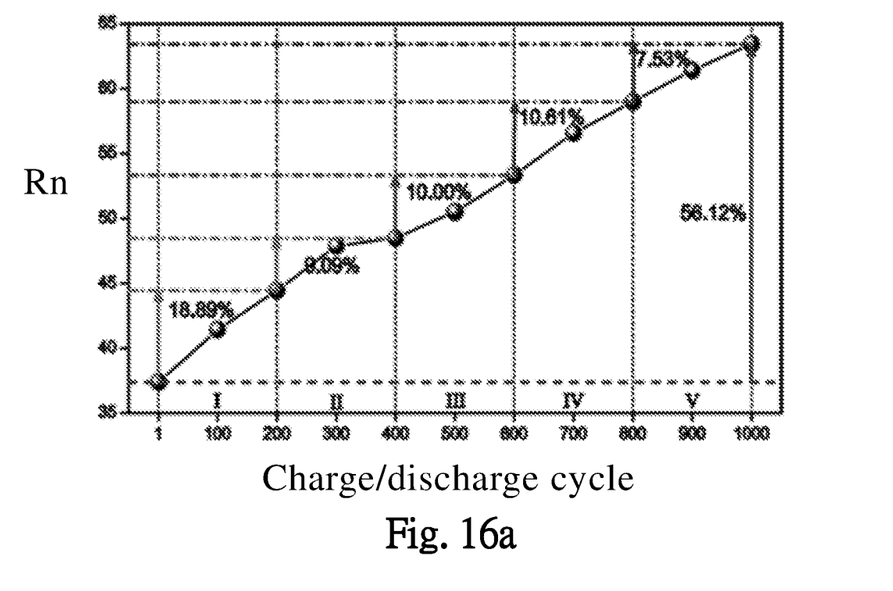
FIGS. 16a and 16b illustrate effects of different charge/discharge cycles on resistances and capacitances in the Warburg impedance of the battery, according to one embodiment of the present invention.
Figure 16B:
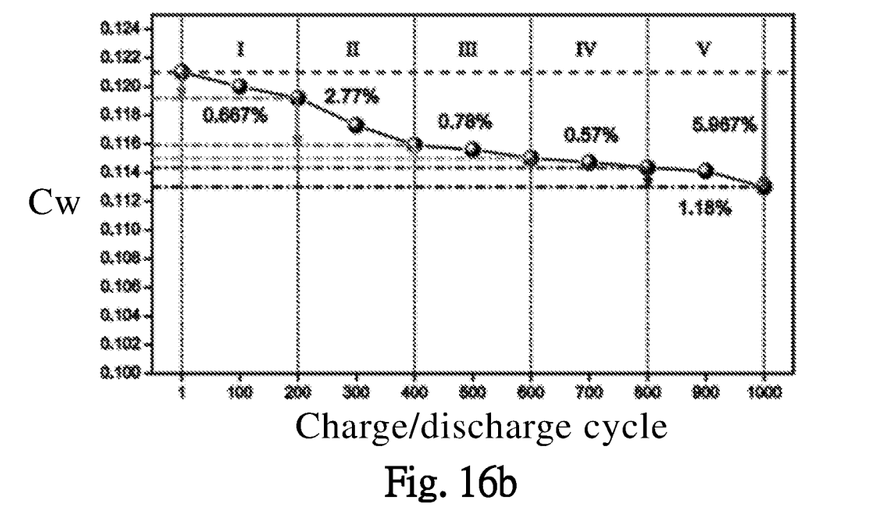

The embodiments of FIGS. 16a and 16b, illustrate different charge/discharge cycles on the resistance Rn and the capacitance Cw of the Warburg impedance Zw. When the charge/discharge cycles increase, the resistance Rn increases but the capacitance Cw decreases.

In view of the above, the present invention can rapidly determine the maximal storage capacity Qm without damaging the battery BAT, to provide charge/discharge capability information of the currently working battery BAT. The present invention solves the problem of inaccurate charge/discharge capability determined by fully discharging the battery in the prior art (for example, Coulomb counting method), and is capable of instantly analyzing the charge/discharge capability during charging the battery.

The present invention has been described in considerable detail with reference to certain preferred embodiments thereof. It should be understood that the description is for illustrative purpose, not for limiting the scope of the present invention. Those skilled in this art can readily conceive variations and modifications without departing from the spirit of the present invention.

What is claimed is:

1. A battery management system, comprising:
   a charging/discharging unit, configured to charge or discharge a battery;
   a sensing unit, sensing a voltage, a discharging current, and discharging duration time of the battery during discharging the battery before the battery is fully discharged;
   a closed form equation consisting of the voltage, the discharging current, and discharging duration time of the battery, for calculating a maximal storage capacity; and
   a calculating unit, determining a charge/discharge capability of the battery based on the closed function.

2. The battery management system of claim 1, wherein the battery is configured to operably discharge for supplying power to an external device.

3. The battery management system of claim 1, wherein the charge/discharge capability of the battery, comprises a state of health (SOH), a state of charge (SOC), or an end of life of the battery.

4. The battery management system of claim 3, wherein the battery comprises a maximal storage capacity, and the battery management system determines the maximal storage capacity according to the voltage, the discharging current, and the discharging duration time; and the battery management system determines the state of charge, according to the maximal storage capacity, the discharging current, and the discharging duration time.

5. The battery management system of claim 4, wherein the battery comprises a plurality of battery cells, each of which comprises a maximal cell storage capacity; and the battery management system determines the maximal cell storage capacity of each of the battery cell, according to a voltage, a discharging current, and discharging duration time of each of the battery cells during discharging the battery.

6. The battery management system of claim 5, wherein the battery cells comprises a lower storage capacity cell, which is adjacent to at least another battery cell in an electrical connection with the lower storage capacity cell, wherein when a maximal cell storage capacity of the lower storage capacity battery cell is lower than a threshold, the battery management system does not conduct the lower storage capacity battery cell with the at least another battery cell in the electrical connection.

7. The battery management system of claim 6, wherein the battery further comprises a replaceable battery cell, wherein when the maximal cell storage capacity of the lower storage capacity battery cell is lower than the threshold, the battery management system conducts the replaceable battery cell with the at least another battery cell in the electrical connection.

8. The battery management system of claim 4, wherein since the battery starting discharging and before the battery is fully discharged, the battery management system determines the state of health and the state of charge of the battery, according to the voltage, the discharging current, and the discharging duration time.

9. The battery management system of claim 4, wherein the battery management system determines the end of life of the battery, according to the state of health and a life threshold ratio.

10. The battery management system of claim 4, wherein the battery comprises a positive electrode and a negative electrode, wherein the battery has a maximum capacity effectiveness of the positive electrode, and a maximum capacity effectiveness of the negative electrode; and the calculating unit determines a charge/discharge capability of the battery based on maximum capacity effectivenesses of the positive and negative electrodes.

11. The battery management system of claim 4, wherein the battery further comprises a Warburg impedance, and the sensing unit senses the Warburg impedance of the battery during the battery charging/discharging, and the calculating unit determines the charge/discharge capability for a diffusion capability of the battery, according to the Warburg impedance.

12. The battery management system of claim 1, wherein the sensing unit senses a working temperature of the battery during discharging the battery, and the calculating unit determines the charge/discharge capability of the battery, according to the voltage, the discharging current, the discharging duration time, and the working temperature.

13. A chip, used in a battery, the chip comprising:
   a charging/discharging unit, configured to charge or discharge a battery;
   a sensing unit, sensing a voltage, a discharging current, and discharging duration time of the battery during discharging the battery before the battery is fully discharged;
   a closed form equation consisting of the voltage, the discharging current, and discharging duration time of the battery, for calculating a maximal storage capacity; and
   a calculating unit, determining a charge/discharge capability of the battery based on the closed function.

* * * * *